United States Patent
An et al.

(10) Patent No.: US 11,800,701 B2
(45) Date of Patent: *Oct. 24, 2023

(54) METHOD FOR FABRICATING SEMICONDUCTOR DEVICES

(71) Applicant: SAMSUNG ELECTRONICS CO., LTD., Suwon-si (KR)

(72) Inventors: Ho Kyun An, Seoul (KR); Bumsoo Kim, Hwaseong-si (KR)

(73) Assignee: SAMSUNG ELECTRONICS CO., LTD.

( * ) Notice: Subject to any disclaimer, the term of this patent is extended or adjusted under 35 U.S.C. 154(b) by 0 days.

This patent is subject to a terminal disclaimer.

(21) Appl. No.: 17/871,059

(22) Filed: Jul. 22, 2022

(65) Prior Publication Data

US 2022/0359533 A1 Nov. 10, 2022

Related U.S. Application Data

(63) Continuation of application No. 17/242,932, filed on Apr. 28, 2021, now Pat. No. 11,430,794.

(30) Foreign Application Priority Data

Oct. 13, 2020 (KR) ........................ 10-2020-0131878

(51) Int. Cl.
*H10B 12/00* (2023.01)
*H01L 21/32* (2006.01)
*H01L 21/02* (2006.01)
*H01L 21/28* (2006.01)
*H01L 21/3215* (2006.01)

(52) U.S. Cl.
CPC ....... *H10B 12/09* (2023.02); *H01L 21/02247* (2013.01); *H01L 21/02252* (2013.01); *H01L 21/28035* (2013.01); *H01L 21/32* (2013.01); *H01L 21/32155* (2013.01); *H10B 12/053* (2023.02); *H10B 12/315* (2023.02); *H10B 12/34* (2023.02); *H10B 12/50* (2023.02)

(58) Field of Classification Search
None
See application file for complete search history.

(56) References Cited

U.S. PATENT DOCUMENTS 6,432,780 B2  8/2002 Chen
7,053,006 B2  5/2006 Hyun et al.
(Continued)

*Primary Examiner* — Alexander G Ghyka
(74) *Attorney, Agent, or Firm* — Myers Bigel, P.A.

(57) ABSTRACT

A method for fabricating a semiconductor device includes providing a substrate including a cell region and a core/peripheral region around the cell region, forming a gate insulating film on the substrate of the core/peripheral region, forming a first conductive film of a first conductive type on the gate insulating film, forming a diffusion blocking film within the first conductive film, the diffusion blocking film being spaced apart from the gate insulating film in a vertical direction, after forming the diffusion blocking film, forming an impurity pattern including impurities within the first conductive film, diffusing the impurities through a heat treatment process to form a second conductive film of a second conductive type and forming a metal gate electrode on the second conductive film, wherein the diffusion blocking film includes helium (He) and/or argon (Ar).

20 Claims, 22 Drawing Sheets

(56) References Cited

U.S. PATENT DOCUMENTS

| | | | |
|---|---|---|---|
| 7,344,948 | B2 | 3/2008 | Sandhu et al. |
| 7,919,373 | B2 | 4/2011 | Lee et al. |
| 9,722,083 | B2 | 8/2017 | Tsai et al. |
| 11,430,794 | B2 * | 8/2022 | An .................... H10B 12/053 |
| 2002/0197837 | A1 * | 12/2002 | Kwak ............. H01L 21/823842 |
| | | | 438/296 |
| 2003/0148632 | A1 | 8/2003 | Chen |
| 2005/0054182 | A1 | 3/2005 | Wang |
| 2005/0236626 | A1 | 10/2005 | Takafuji et al. |
| 2007/0196988 | A1 | 8/2007 | Shroff et al. |
| 2013/0140700 | A1 | 6/2013 | Ohmi |
| 2015/0021684 | A1 | 1/2015 | Lee et al. |
| 2016/0163535 | A1 | 6/2016 | Renauld et al. |
| 2016/0197272 | A1 | 7/2016 | Yu et al. |
| 2017/0084710 | A1 | 3/2017 | Koh et al. |

* cited by examiner

METHOD FOR FABRICATING SEMICONDUCTOR DEVICES

CROSS-REFERENCE TO RELATED APPLICATIONS

This application is a continuation of and claims priority to U.S. patent application Ser. No. 17/242,932, filed Apr. 28, 2021, which claims priority and all the benefits accruing therefrom under 35 U.S.C. § 119 to Korean Patent Application No. 10-2020-0131878 filed on Oct. 13, 2020, in the Korean Intellectual Property Office, the contents of which are herein incorporated by reference.

BACKGROUND

1. Field of the Disclosure

The present disclosure relates to methods for fabricating semiconductor devices, and more specifically, to methods for fabricating semiconductor devices having improved performance and reliability.

2. Description of the Related Art

In a DRAM structure that uses a dual polysilicon gate, it is useful to dope impurities to control a threshold voltage of a PMOS gate. However, when impurities are doped, a short channel effect (SCE) and a negative bias temperature instability (NBTI) deterioration may occur. Therefore, in order to prevent and/or reduce the short channel effect (SCE) and the negative bias temperature instability (NBTI) deterioration, a technique for controlling permeation or diffusion of impurities may be needed.

SUMMARY

Aspects of the present disclosure provide methods for fabricating semiconductor devices in which the performance and reliability of the product are improved by controlling a concentration of impurities in a conductive film when fabricating a PMOS gate in a core/peripheral region.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an embodiment of the present disclosure, there is provided a method for fabricating a semiconductor device, the method comprising, providing a substrate including a cell region and a core/peripheral region around the cell region, forming a gate insulating film on the core/peripheral region of the substrate, forming a first conductive film of a first conductive type on the gate insulating film, forming a diffusion blocking film within the first conductive film, the diffusion blocking film being spaced apart from the gate insulating film in a vertical direction, after forming the diffusion blocking film, forming an impurity pattern including impurities within the first conductive film, diffusing the impurities through a heat treatment process to form a second conductive film of a second conductive type different from the first conductive type and forming a metal gate electrode on the second conductive film, wherein the diffusion blocking film includes helium (He) and/or argon (Ar).

According to aforementioned and other embodiments of the present disclosure, there is provided a method for fabricating a semiconductor device, the method comprising, providing a substrate including a cell region and a core/peripheral region around the cell region, wherein the core/peripheral region comprises a first region and a second region, forming a first gate insulating film on the first region, forming a second gate insulating film on the second region, forming a first conductive film on the first gate insulating film, forming a second conductive film having a first conductive type on the second gate insulating film, forming a mask film on the first conductive film on the first region, forming a diffusion blocking film within the second conductive film on the second region, the diffusion blocking film being spaced apart from the second gate insulating film in a vertical direction, after forming the diffusion blocking film, forming an impurity pattern including impurities within the second conductive film on the second region, diffusing the impurities through a heat treatment process to form a third conductive film of a second conductive type different from the first conductive type on the second region, removing the mask film, forming a first metal gate electrode on the first conductive film on the first region and forming a second metal gate electrode on the third conductive film on the second region, wherein the diffusion blocking film includes helium (He) and/or argon (Ar).

According to aforementioned and other embodiments of the present disclosure, there is provided a method for fabricating a semiconductor device, the method comprising, providing a substrate including a cell region and a core/peripheral region around the cell region, forming a gate insulating film on the core/peripheral region, nitriding a part of the gate insulating film, forming a first conductive film of a first conductive type on the gate insulating film, forming a second conductive film on the cell region, forming a mask film on the second conductive film, forming a diffusion blocking film within the first conductive film on the core/peripheral region, the diffusion blocking film being spaced apart from the gate insulating film in a vertical direction, after forming the diffusion blocking film, forming an impurity pattern including impurities within the first conductive film on the core/peripheral region, diffusing the impurities through a heat treatment process to form a third conductive film of a second conductive type different from the first conductive type on the core/peripheral region, removing the mask film, forming a first metal gate electrode on the third conductive film on the core/peripheral region and forming a second metal gate electrode on the second conductive film on the cell region, wherein the diffusion blocking film includes helium (He) and/or argon (Ar).

BRIEF DESCRIPTION OF THE FIGURES

The above and other aspects and features of the present disclosure will become more apparent by describing in detail example embodiments thereof referring to the attached drawings, in which.

DETAILED DESCRIPTION

Figure 1:
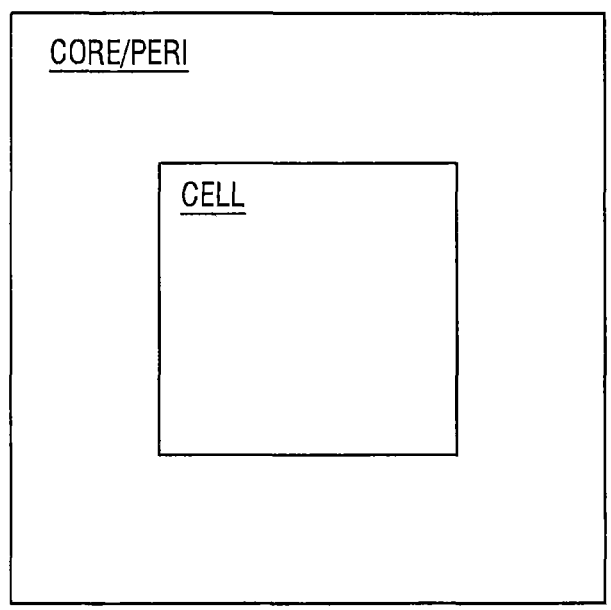
FIG. 1 is an example layout diagram for explaining a semiconductor device according to some embodiments of the present disclosure.

Hereinafter, methods for fabricating semiconductor devices according to some embodiments of the present disclosure will be described referring to FIGS. 1 to 21. The attached drawings may not necessarily be shown in a constant ratio, and in some embodiments, proportion of at least some of the structures shown in the drawings may also be exaggerated to clearly show the characteristics of the embodiments.

FIG. 1 is an example layout diagram for explaining a semiconductor device according to some embodiments of the present disclosure.

Referring to FIG. 1, a semiconductor device according to some embodiments of the present disclosure may include a cell region CELL and a core or peripheral (core/peri) region CORE/PERI.

An element isolation film 305 (see, e.g., FIG. 23), a base insulation pattern 730, a bit line BL, a direct contact DC, a buried contact BC, a landing pad LP, a capacitor 790, and the like, which will be described below, may be formed in the cell region CELL to implement semiconductor memory elements on a substrate 310.

The core/peri region CORE/PERI may be arranged around the cell region CELL. For example, the core/peri region CORE/PERI may surround the cell region CELL (e.g., in plan view). Control elements and dummy elements such as first and second conductive lines 440 and 550, first and second metal gate electrode lines 460 and 560, and first and second gate spacers 480 and 580 which will be described below, may be formed in the core/peri region CORE/PERI to control the function of the semiconductor memory elements formed in the cell region CELL.

FIGS. 2 to 9 are intermediate stage diagrams for explaining a method for fabricating a semiconductor device according to some embodiments of the present disclosure. FIG. 10 is a graph showing a concentration of helium of a second conductive film taken along C-C' of FIG. 9 according to a depth of a diffusion blocking film. FIGS. 11 to 21 are intermediate stage diagrams for explaining the method for fabricating the semiconductor device according to some embodiments of the present disclosure.

FIGS. 3, 5, 7 to 9, 11 to 14, 16 and 18 to 19 are diagrams showing the core/peri region CORE/PERI. FIGS. 4, 6, 15, 17, and 20 to 23 are diagrams showing a cell region CELL.

Figure 2:
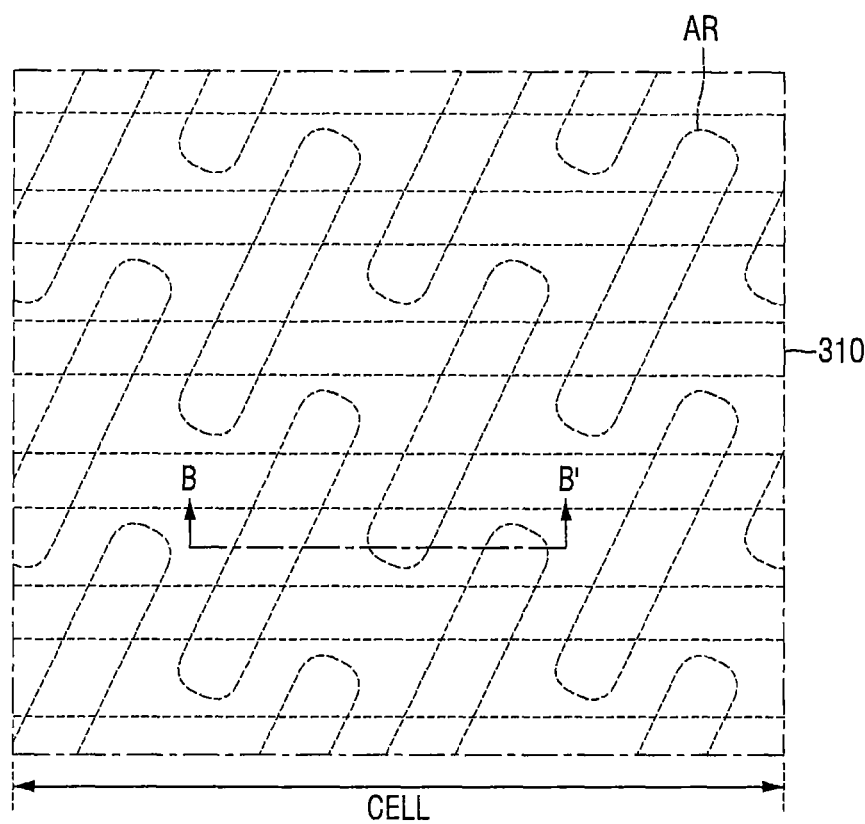
FIGS. 2 to 9 are intermediate stage diagrams for explaining a method for fabricating a semiconductor device according to some embodiments of the present disclosure.
Figure 2:
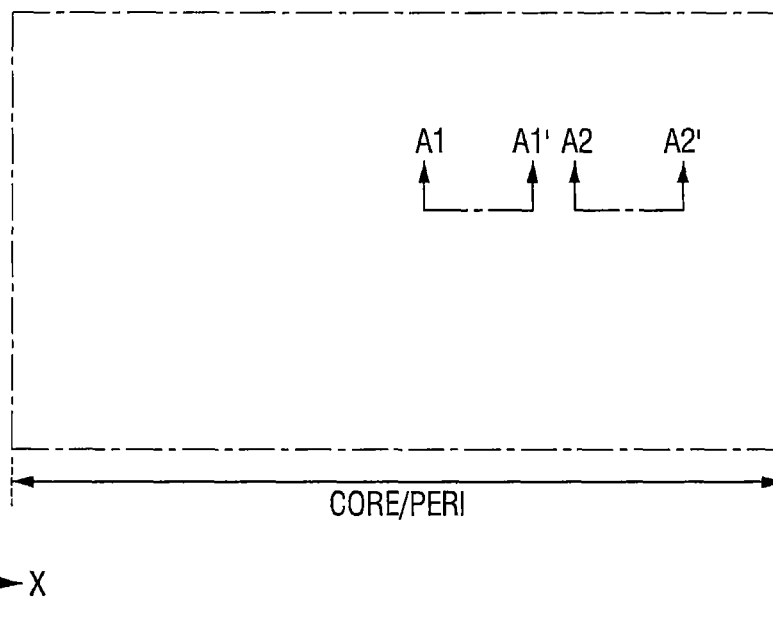

FIG. 2 is a partial layout diagram for explaining the cell region CELL and the core/peri region CORE/PERI.

Referring to FIG. 2, a substrate 310 may include an active region AR. In some embodiments, for example in response to a decrease in the design rules of the semiconductor memory device, the active region AR may be formed in the form of diagonal bars.

For example, as shown in FIG. 2, the active region AR may be in the form of a bar extending in an arbitrary direction different from a first direction X and a second direction Y, on a plane in which the first direction X and the second direction X extend. In some embodiments, the direction along which the active region AR extends may form an acute angle with the first direction X. The acute angle may be an arbitrary angle greater than 0° and smaller than 90°. For example, the acute angle may be, but is not limited to, 60°.

The active region AR may be in the form of a plurality of bars extending in directions parallel to each other. Also, the center of one active region AR of the plurality of active regions AR may be placed to be adjacent to a terminal portion (e.g., an end portion) of another active region AR. The active region AR may include impurities and may function, for example, as a source/drain region.

Figure 3:
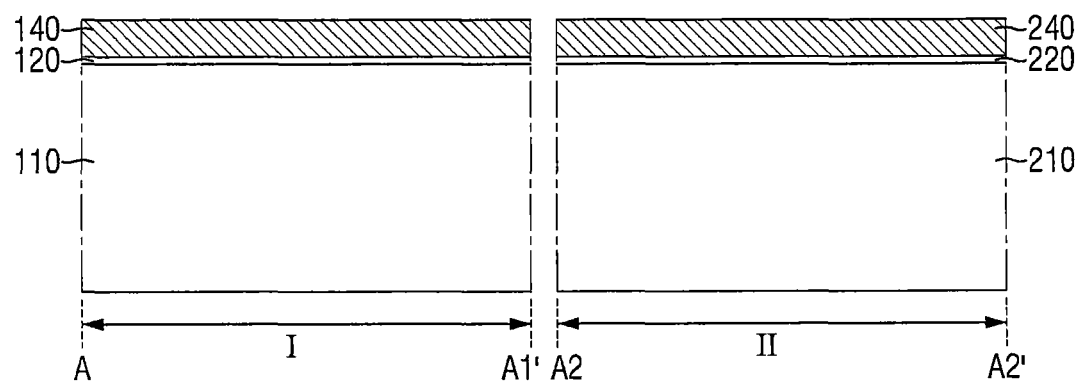
Figure 4:
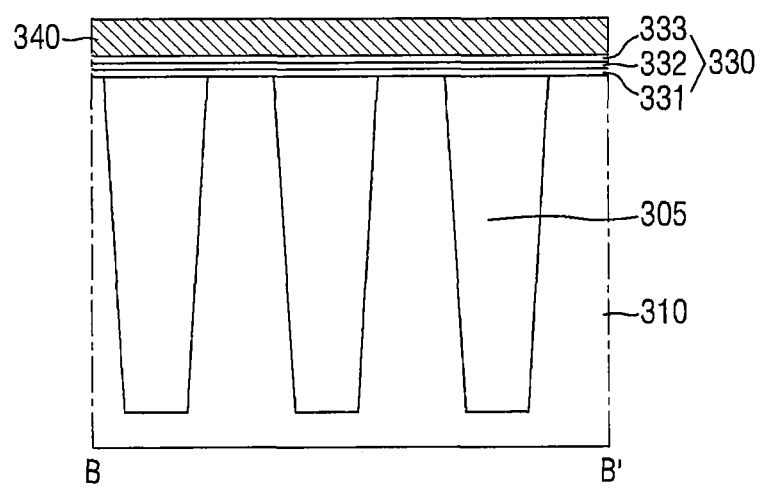

FIG. 3 is a cross-sectional view taken along lines A1-A1' and A2-A2' in the core/peri region CORE/PERI of FIG. 2. FIG. 4 is a cross-sectional view taken along a line B-B' in the cell region CELL of FIG. 2.

For example, in FIG. 3, although a cut line taken along lines A1-A1' and A2-A2' of FIG. 2 is described as being taken along the first direction X, the embodiments described herein are not limited thereto. Unlike those shown, the cut line taken along the lines A1-A1' and A2-A2' of FIG. 2 may be a cut line extending along the second direction Y.

Referring to FIGS. 3 and 4, the core/peri region CORE/PERI may include a first region I taken along line A1-A1', and a second region II taken along line A2-A2'. The first region I and the second region II may be adjacent to or spaced apart from each other.

A first gate insulating film 120 may be formed on a substrate 110 of the first region I of the core/peri region CORE/PERI. A first conductive film 140 may be formed on the first gate insulating film 120. A second gate insulating film 220 may be formed on a substrate 210 of the second region II. A second conductive film 240 of a first conductive type may be formed on the second gate insulating film 220.

An element isolation film 305 may be formed in the substrate 310 of the cell region CELL. The element isolation film 305 may have an STI (shallow trench isolation) structure having excellent element isolation characteristics. A base insulating film 330 may be formed on the substrate 310 of the cell region CELL. A third conductive film 340 may be formed on the base insulating film 330.

Although the base insulating film 330 may be a single film, it may also be and/or include multiple films as shown. For example, the base insulating film 330 may include a first insulating film 331, a second insulating film 332, and a third insulating film 333 that are sequentially stacked on the substrate 310 of the cell region CELL. As used herein, the term "and/or" includes any and all combinations of one or more of the associated listed items. Expressions such as "at least one of," when preceding a list of elements, modify the entire list of elements and do not modify the individual elements of the list.

The element isolation film 305 may define a plurality of active regions AR. In FIG. 4, although the side face of the element isolation film 305 is shown to have an inclination, this is only a process feature, and the scope of the present disclosure is not limited thereto.

The element isolation film 305 may include, but is not limited to, at least one of silicon oxide, silicon nitride, and a combination thereof. The element isolation film 305 may also be a single film made of one kind of insulating material, or may also be or include multiple films made of a combination of various kinds of insulating materials.

The substrates 110, 210 and 310 may be bulk silicon or SOI (silicon-on-insulator). In some embodiments, the substrates 110, 210 and 310 may be a silicon substrate, or may include other materials, for example, but not limited to, silicon germanium, SGOI (silicon germanium on insulator), indium antimonide, lead tellurium compounds, indium arsenic, indium phosphorus, gallium arsenide or gallium antimonide. In some embodiments of the disclosure, the substrates 110, 210 and 310 will be described as including a silicon substrate, but it will be understood that the embodiments described herein are not limited thereto.

Each of the first gate insulating film 120 and the second gate insulating film 220 may include, for example, silicon oxide, silicon nitride, silicon oxynitride and/or a high dielectric constant material having a higher dielectric constant than the silicon oxide. The high dielectric constant material may include, for example, at least one of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and combinations thereof.

Although the above-mentioned high dielectric constant material was described mainly for oxides, in some embodiments the above-mentioned high dielectric constant material may include, but is not limited to, one or more of nitride (e.g., hafnium nitride) or oxynitride (e.g., hafnium oxynitride) of the above-mentioned metal material (e.g., hafnium).

The first insulating film 331 may include, for example, a silicon oxide. The second insulating film 332 may include a material having etching selectivity different from the first insulating film 331. For example, the second insulating film 332 may include silicon nitride. For example, the third insulating film 333 may include a silicon oxide.

The first gate insulating film 120 and the second gate insulating film 220 of the core/peri region CORE/PERI, and the third insulating film 333 of the cell region CELL may be formed in the same process.

A part of the second gate insulating film 220 may be nitrided through a nitrogen plasma treatment process before forming the second conductive film 240 in the core/peri region CORE/PERI.

The nitrogen plasma treatment process may include a post-nitridation annealing (PNA) process. The post-nitridation annealing process may include, for example, at least one of a rapid thermal anneal (RTA) process, a millisecond anneal process, a flash anneal process, and a laser anneal process. The post-nitridation annealing process may be performed at 900° C. or higher and 1200° C. or lower.

The first conductive film 140, the second conductive film 240, and the third conductive film 340 may include polysilicon. The first conductive film 140, the second conductive film 240, and the third conductive film 340 may be formed in the same process.

Figure 5:
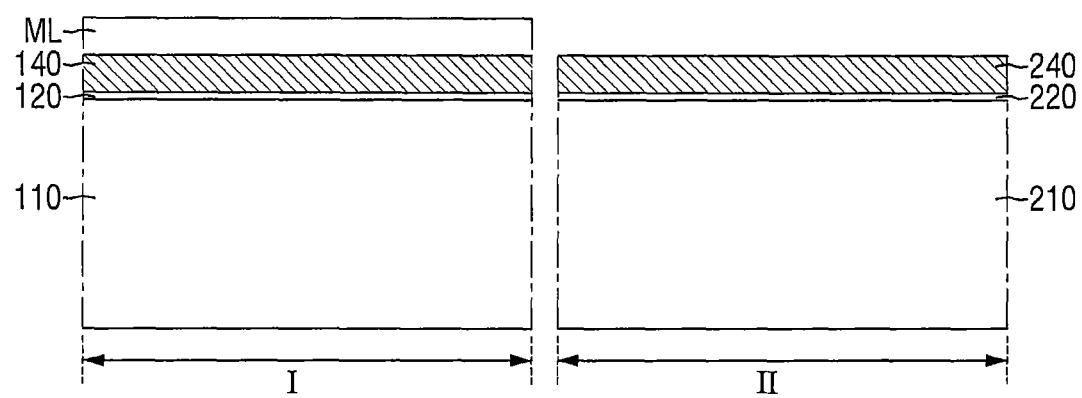

Referring to FIG. 5, a mask film ML may be formed on the first conductive film 140 in the first region I of the core/peri region CORE/PERI.

Figure 6:
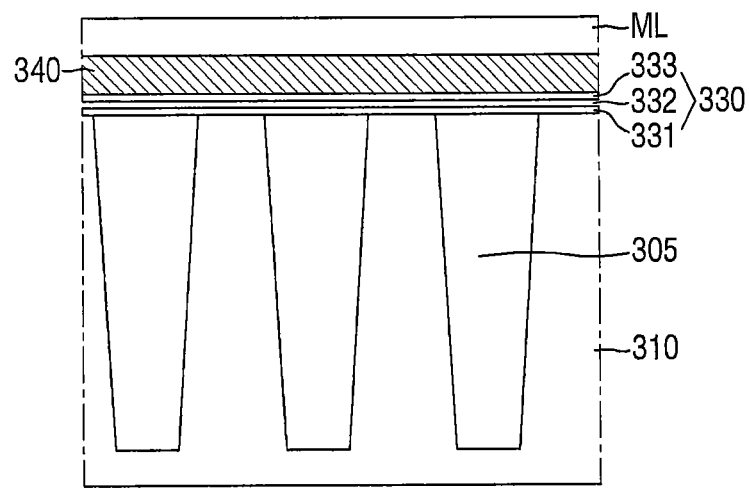

Referring to FIG. 6, the mask film ML may be formed on the third conductive film 340 in the cell region CELL.

Figure 7:
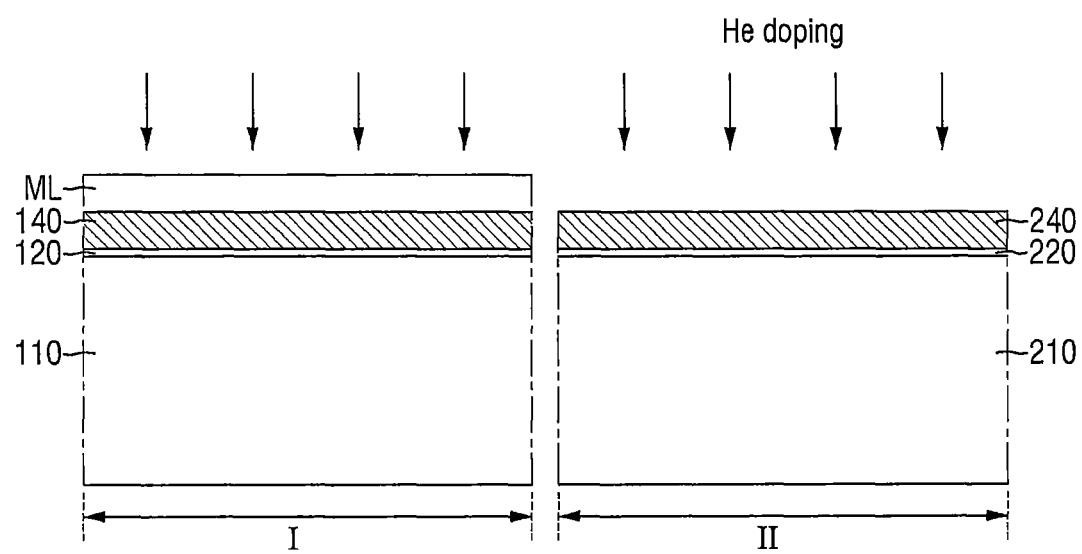

Referring to FIG. 7, a plasma doping process may be performed in the second region II of the core/peri region CORE/PERI. The plasma doping process may use a dose of $10^{14}$ or more and $10^{17}$ or less. Also, the plasma doping process may use implantation energy of 0 kV or more and 10 kV or less.

Figure 8:
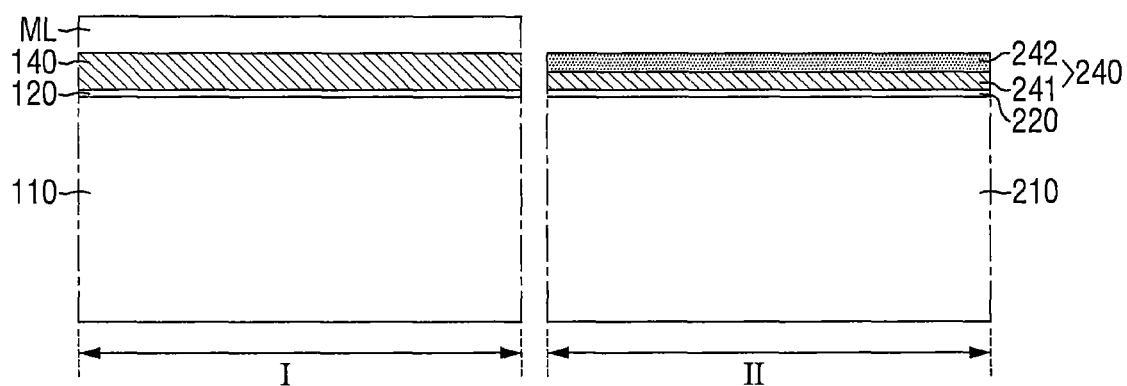
Figure 9:
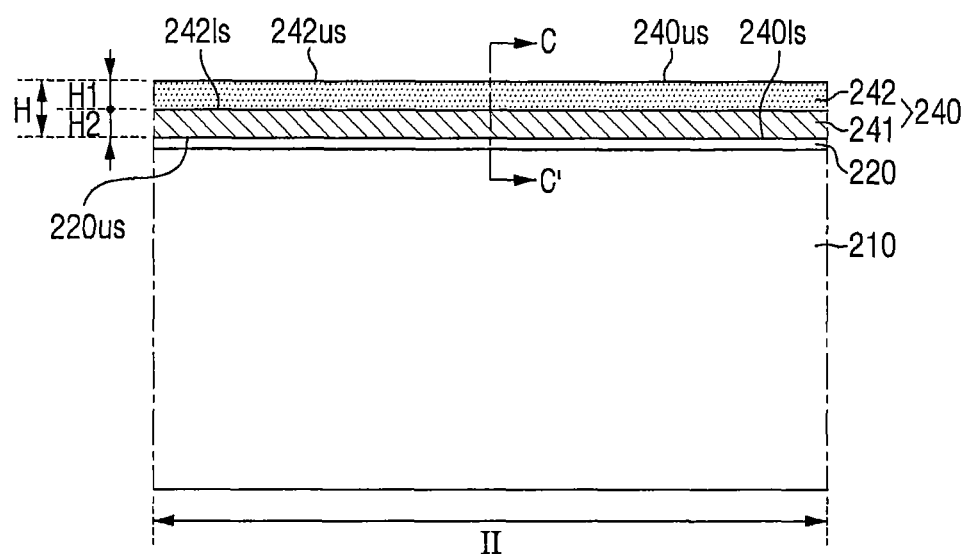
Figure 10:
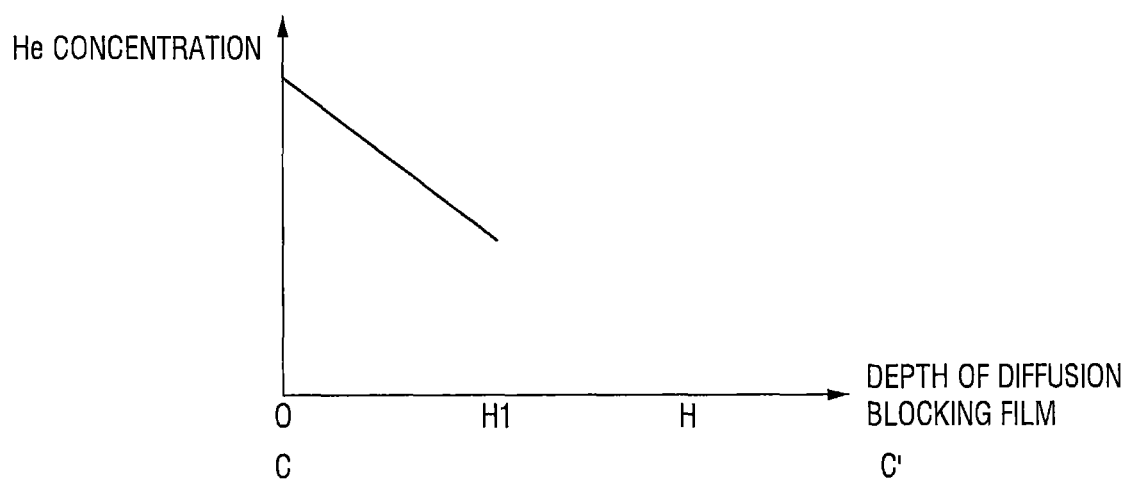
FIG. 10 is a graph showing a concentration of helium of a second conductive film taken along C-C' of FIG. 9 according to a depth of a diffusion blocking film.

FIG. 9 is an enlarged view of the second region II of FIG. 8.

Referring to FIGS. 8 and 9, a diffusion blocking film 242 may be formed in the second conductive film 240 of the second region II of the core/peri region CORE/PERI.

The second conductive film 240 may include a second_1 conductive film 241, and a diffusion blocking film 242. Although the diffusion blocking film 242 may be formed using a plasma doping process, the scope of the present disclosure is not limited thereto, and the diffusion blocking film 242 may also be formed, for example, using a beamline ion implantation process.

The diffusion blocking film 242 may not be formed in the first region I of the core/peri region CORE/PERI.

The diffusion blocking film 242 may include a lower face 242*ls* facing the substrate 210, and an upper face 242*us* opposite to the lower face 242*ls*. The second conductive film 240 may include a lower face 240*ls* facing the substrate 210, and an upper face 240*us* opposite to the lower face 240*ls*.

The upper face 242*us* of the diffusion blocking film 242 may be located in the same plane as the upper face 240*us* of the second conductive film 240. However, the scope of the present disclosure is not limited thereto, and the upper face 242*us* of the diffusion blocking film 242 may be located below the upper face 240*us* of the second conductive film 240. Here, the expression "A is located below B" may mean that A is located closer to the substrate 210 in the vertical direction than B.

The diffusion blocking film 242 may be spaced apart from the second gate insulating film 220 in a vertical direction. Here, the vertical direction may mean a direction perpendicular to the upper face 220*us* of the second gate insulating film 220. The upper face 220*us* of the second gate insulating film 220 may be in contact with the lower face 240*ls* of the second conductive film 240. The upper face 220*us* of the second gate insulating film 220 may be at the same level as the lower face 240*ls* of the second conductive film 240.

The diffusion blocking film 242 may be formed at a predetermined depth in the vertical direction from the upper face 240*us* of the second conductive film 240. The lower face 242*ls* of the diffusion blocking film 242 may be spaced apart from the upper face 220*us* of the second gate insulating film 220 by a certain distance H2 in the vertical direction.

Thus, the diffusion blocking film 242 may have a thickness H1 in the vertical direction. A distance in the vertical direction between the upper face 240*us* of the second conductive film 240 and the lower face 242*ls* of the diffusion blocking film 242 may be a thickness H1 of the diffusion blocking film 242 in the vertical direction.

The thickness H1 of the diffusion blocking film 242 may vary depending on the implantation energy of the plasma. For example, the greater the plasma implantation energy is, the greater the thickness H1 of the diffusion blocking film 242 may be. The larger the plasma implantation energy, the deeper the diffusion blocking film 242 may be formed in the second conductive film 240. For example, when the plasma implantation energy is 10 kV, the thickness H1 of the diffusion blocking film 242 may be greater than a case where the plasma implantation energy is 5 kV.

The diffusion blocking film 242 may include at least one of helium (He) and/or argon (Ar). The diffusion blocking film 242 may be a part of the second conductive film 240 including a plasma-doped dopant.

That is, when the plasma doping process is performed in FIG. 7, helium plasma or argon plasma may be doped. When the helium plasma is doped, the diffusion blocking film 242 may include helium. When the argon plasma is doped, the diffusion blocking film 242 may include argon. Hereinafter, the diffusion blocking film 242 will be described as including helium, but it will be understood that the embodiments of the present disclosure are not limited thereto.

FIG. 10 is a graph showing the concentration of helium of the second conductive film taken along line C-C' of FIG. 9 according to the depth.

Referring to FIGS. 9 and 10, the concentration of helium may gradually decrease from the upper face 242*us* of the diffusion blocking film 242 toward the lower face 242*ls* of the diffusion blocking film 242.

That is, the concentration may gradually decrease depending on the depth of the diffusion blocking film 242. The concentration of helium from the lower face 242*ls* of the diffusion blocking film 242 to the lower face 240*ls* of the second conductive film 240 may be 0. However, the scope of the present disclosure is not limited thereto.

Although the drawings show that the concentration of helium decreases constantly (e.g., linearly) depending on the depth of the diffusion blocking film 242, the scope of the present disclosure is not limited thereto.

Figure 11:
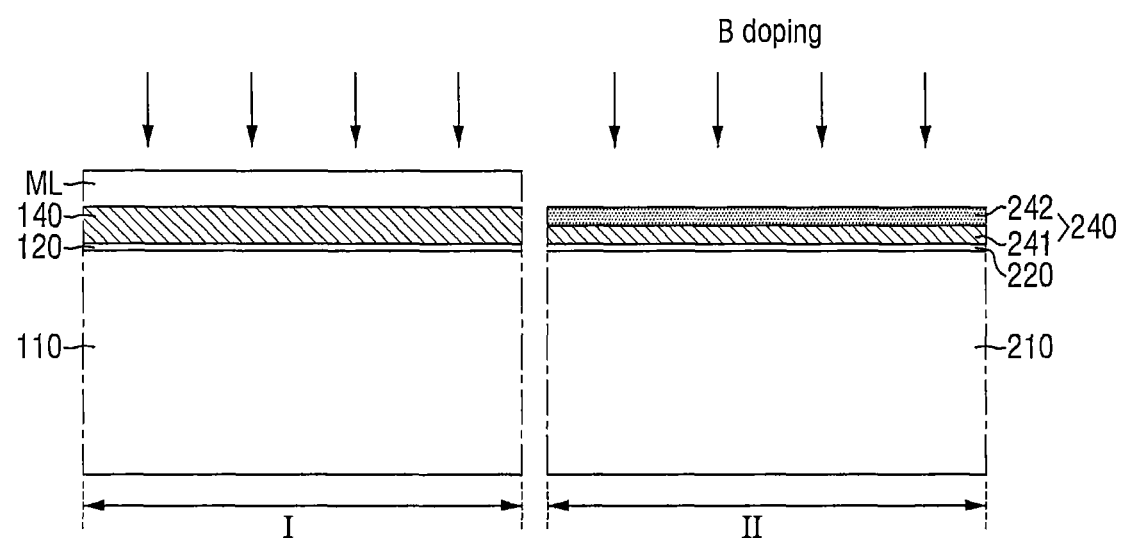
FIGS. 11 to 21 are intermediate stage diagrams for explaining the method for fabricating the semiconductor device according to some embodiments of the present disclosure.
Figure 12:
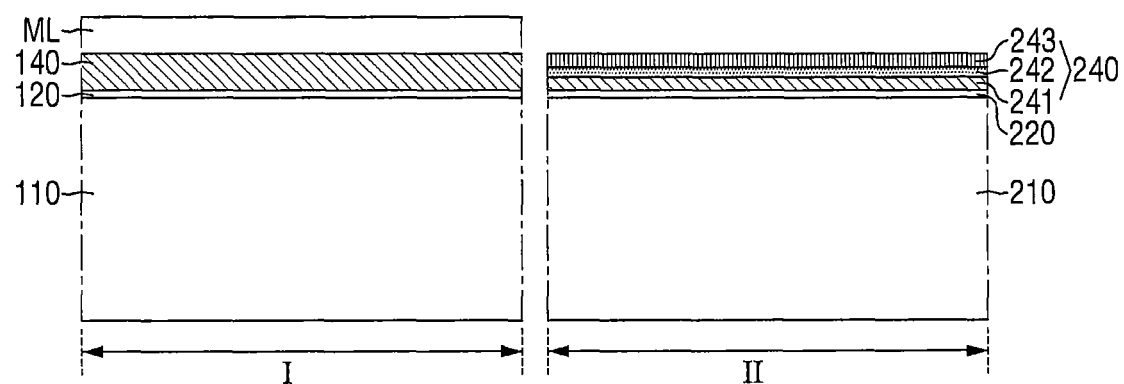

Referring to FIGS. 11 and 12, an impurity pattern 243 may be formed in the second region II of the core/peri region CORE/PERI.

The impurity pattern 243 may include impurities. The impurities may be either boron (B) or phosphorus (P). In the present disclosure, impurities will be described as including boron, but it will be understood that the embodiments of the present disclosure are not limited thereto.

The impurity pattern 243 may be formed, for example, using a plasma doping process. The impurity pattern 243 may not be formed in the first region I of the core/peri region CORE/PERI. The impurity pattern 243 may be formed inside the second conductive film 240. The second conductive film 240 may include the impurity pattern 243, the diffusion blocking film 242, and the second_1 conductive film 241.

Figure 13:
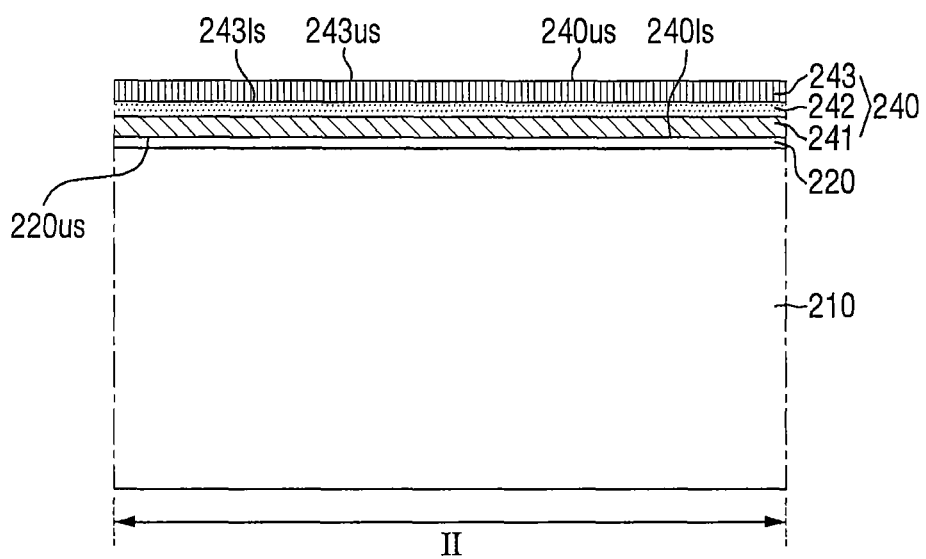

FIG. 13 is an enlarged view of the second region II of FIG. 12.

Referring to FIG. 13, the impurity pattern 243 may include a lower face 243*ls* facing the substrate 210, and an upper face 243*us* opposite to the lower face 243*ls*.

The lower face 243*ls* of the impurity pattern 243 may be located above the lower face 240*ls* of the second conductive film 240. Here, the expression "A is located above B" may mean that A is located vertically farther away from the substrate 210 than B.

The lower face 243*ls* of the impurity pattern 243 may be located above the lower face 242*ls* of the diffusion blocking film 242. However, the scope of the present disclosure is not limited thereto, and the lower face 243*ls* of the impurity pattern 243 may be located below the lower face 242*ls* of the diffusion blocking film 242.

The upper face 243*us* of the impurity pattern 243 may be located in the same plane as the upper face 240*us* of the second conductive film 240. Although not shown in the drawings, the concentration of impurities of the impurity pattern 243 may gradually decrease depending on the depth of the impurity pattern 243. The concentration of impurities of the impurity pattern 243 may gradually decrease from the upper face 243*us* of the impurity pattern 243 toward the lower face 243*ls* of the impurity pattern 243.

Figure 14:
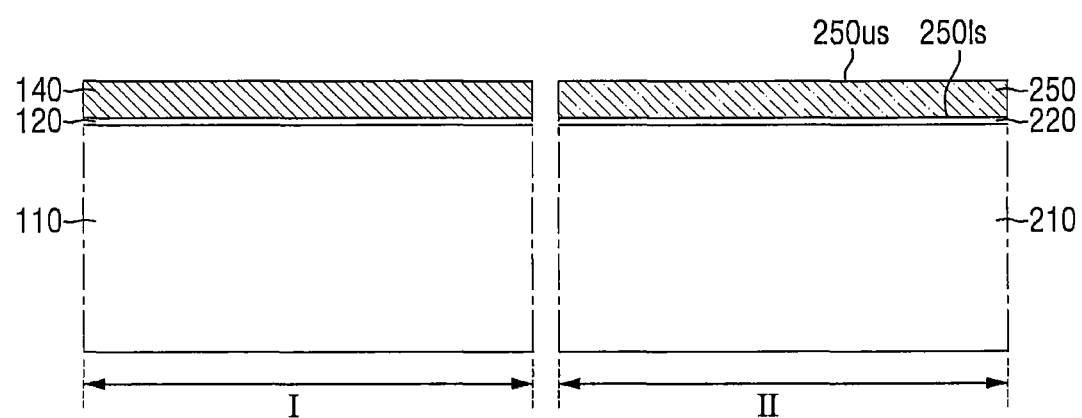
Figure 15:
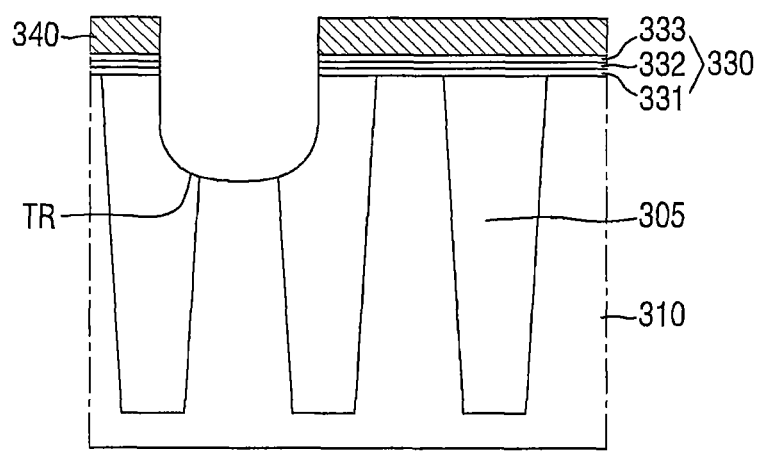

Referring to FIGS. 14 and 15, a fourth conductive film 250 may be formed in the second region II of the core/peri region CORE/PERI.

For example, a heat treatment process may be performed on the cell region CELL and the core/peri region CORE/PERI. The fourth conductive film may be formed in the core/peri region CORE/PERI through the heat treatment process.

For example, the impurities of the impurity pattern 243 may be diffused into the second conductive film of the first conductive type (e.g., 240 of FIG. 13) to form a fourth conductive film 250 of the second conductive type different from the first conductive type.

The fourth conductive film 250 may be formed on the second gate insulating film 220. The fourth conductive film 250 may have the second conductive type. The fourth conductive film 250 may have a lower face 250*ls* facing the substrate 210, and an upper face 250*us* opposite to the lower face 250*ls*. The fourth conductive film 250 may include polysilicon doped with impurities.

Although not shown in the drawings, the concentration of impurities in the fourth conductive film 250 may decrease from the upper face 250*us* of the fourth conductive film 250 toward the lower face 250*ls* of the third conductive film 350. As the diffusion blocking film (e.g., 242 of FIG. 13) prevents and/or reduces the diffusion of impurities, the concentration of impurities may decrease on the lower face 250*ls* of the fourth conductive film 250.

Specifically, when a heat treatment process is performed on the core/peri region CORE/PERI, the impurities of the impurity pattern 243 may be diffused into the lower face 240*ls* of the second conductive film 240 from the upper face 240*us* of the second conductive film 240. Impurities are diffused into the lower face 240*ls* of the second conductive film 240 from the upper face 240*us* of the second conductive film 240, and then may be trapped by the diffusion blocking film 242. Therefore, the concentration of impurities on the lower face 250*ls* of the fourth conductive film 250 may vary depending on the presence or absence of the diffusion blocking film. For example, when impurities are diffused after the diffusion blocking film is formed, the concentration of impurities of the fourth conductive film 250 may be lowered at the lower face 250*ls* of the fourth conductive film 250.

Subsequently, a mask film ML may be removed in the first region I of the core/peri region CORE/PERI. The mask film ML may be removed in the cell region CELL.

A trench TR that penetrates the third conductive film 340, the base insulating film 330, and the substrate 310 may be formed in the cell region CELL.

Figure 16:
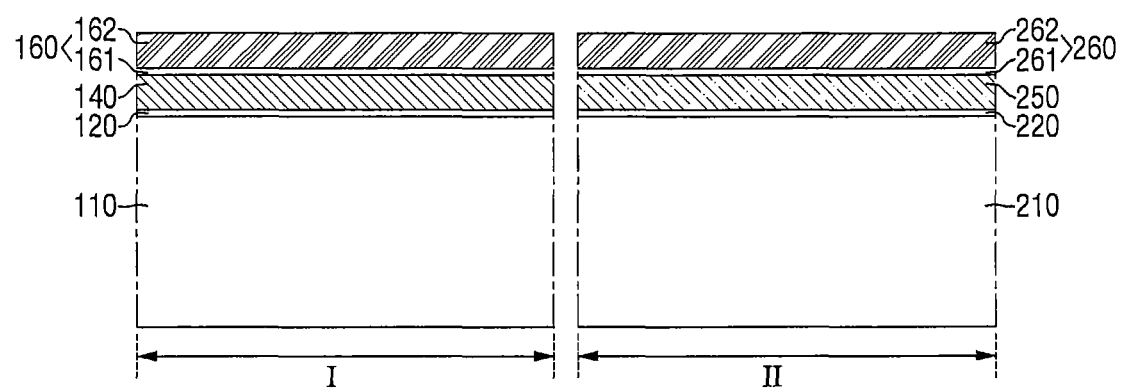
Figure 17:
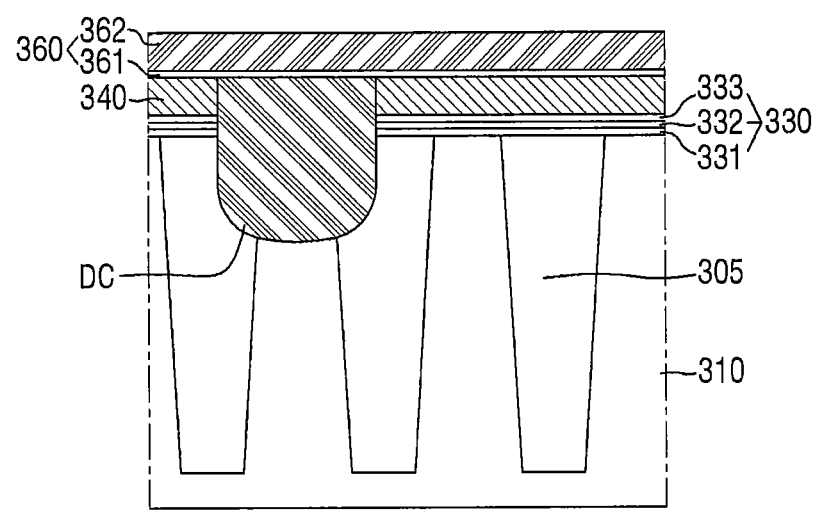

Referring to FIGS. 16 and 17, a first metal gate electrode 160 may be formed on the first conductive film 140, in the first region I of the core/peri region CORE/PERI.

A second metal gate electrode 260 may be formed on the fourth conductive film 250, in the second region II of the core/peri region CORE/PERI.

A direct contact DC which is in and/or fills the trench TR may be formed in the cell region CELL. The direct contact DC may be formed inside the trench TR. Also, the direct contact DC may be in contact with the substrate 310. For example, the direct contact DC may be in contact with the center of the active region (e.g., AR of FIG. 2) exposed by the trench TR. The active region of the substrate 310 being in contact with the direct contact DC may function as a source/drain region. A third metal gate electrode 360 may be formed on the direct contact DC and the third conductive film 340. The first to third metal gate electrodes 160, 260 and 360 may be formed in the same process.

The first metal gate electrode 160 may include a first_1 metal gate electrode 161, and a first_2 metal gate electrode 162. The second metal gate electrode 260 may include a second_1 metal gate electrode 261, and a second_2 metal gate electrode 262. The third metal gate electrode 360 may include a third_1 metal gate electrode 361 and a third_2 metal gate electrode 362.

Each of the first_1 metal gate electrode 161, the second_1 metal gate electrode 261 and the third_1 metal gate electrode 361 may include, for example, polysilicon, TiN, TiSiN, tungsten, tungsten silicide, or a combination thereof.

Each of the first_2 metal gate electrode 162, the second_2 metal gate electrode 262 and the third_2 metal gate electrode 362 may include, for example, polysilicon, TiN, TiSiN, tungsten, tungsten silicide, or a combination thereof.

The direct contact DC may include a conductive material. In some embodiments, the direct contact DC may include the same material as the third conductive film 340. For example, the direct contact DC may include polysilicon. However, the scope of the present disclosure is not limited thereto, and the direct contact DC may include a material different from the third conductive film 340 depending on the fabricating process.

Although not shown in FIG. 16, a first capping film may be formed on the first metal gate electrode 160 in the first region I of the core/peri region CORE/PERI.

In some embodiments, although not illustrated in FIG. 16, a second capping film may be formed on the second metal gate electrode 260, in the second region II of the core/peri region CORE/PERI.

Figure 18:
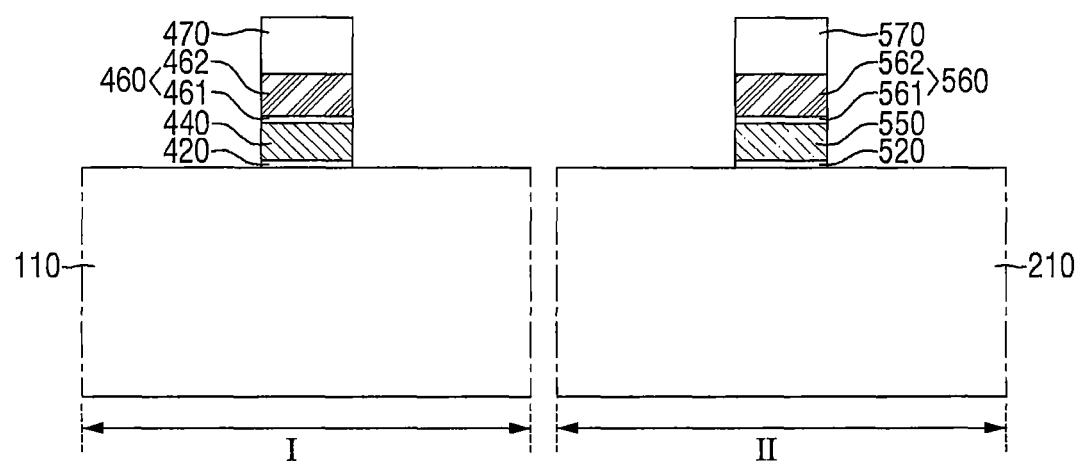

Subsequently, referring to FIG. 18, the first capping film, the first metal gate electrode 160, the first conductive film 140, and the first gate insulating film 120 may be patterned to form a first capping pattern 470, a first metal gate electrode line 460, a first conductive line 440 and a first gate insulating line 420. The first metal gate electrode line 460 may include a first_1 metal gate electrode line 461 and a first_2 metal gate electrode line 462.

Similarly, the second capping film, the second metal gate electrode 260, the fourth conductive film 250, and the second gate insulating film 220 may be patterned to form a second capping pattern 570, a second metal gate electrode line 560, a second conductive line 550 and a second gate insulating line 520. The second metal gate electrode line 560 may include a second_1 metal gate electrode line 561 and a second_2 metal gate electrode line 562.

Each of the first capping pattern 470 and the second capping pattern 570 may include, for example, at least one of silicon nitride (SiN), silicon oxynitride (SiON), silicon oxide ($SiO_2$), silicon carbonitride (SiCN), silicon oxycarbonitride (SiOCN) and combinations thereof.

Figure 19:
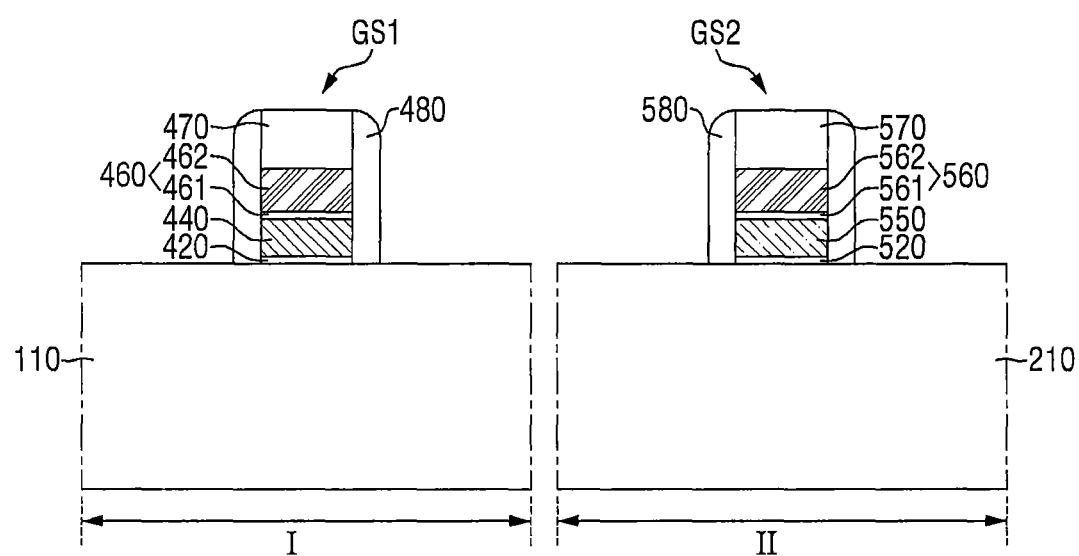

Referring to FIG. 19, the first gate structure GS1 and the second gate structure GS2 may be formed in the core/peri region CORE/PERI.

In the first region I of the core/peri region CORE/PERI, a first gate spacer 480 may be formed on both side walls of the first capping pattern 470, the first metal gate electrode line 460, the first conductive line 440, and the first gate insulating line 420.

In the second region II of the core/peri region CORE/PERI, a second gate spacer 580 may be formed on both side walls of the second capping pattern 570, the second metal gate electrode line 560, the second conductive line 550 and the second gate insulating line 520.

The first gate structure GS1 may include the first gate insulating line 420, the first conductive line 440, the first metal gate electrode line 460, the first capping pattern 470, and the first gate spacer 480.

The second gate structure GS2 may include the second gate insulating line 520, the second conductive line 550, the second metal gate electrode line 560, the second capping pattern 570, and the second gate spacer 580.

Although each of the first gate spacer 480 and the second gate spacer 580 is shown as a single film, the spacers may be or include multiple films. For example, each of the first gate spacer 480 and the second gate spacer 580 may include, but is not limited to, one of a silicon oxide film, a silicon nitride film, a silicon oxynitride film (SiON), a silicon oxycarbonitride film (SiOCN), air, and combinations thereof.

The first gate structure GS1 may be an NMOS gate. The second gate structure GS2 may be a PMOS gate.

Although not shown in the drawings, a third capping film may be formed on the third metal gate electrode 360 in the cell region CELL.

Figure 20:
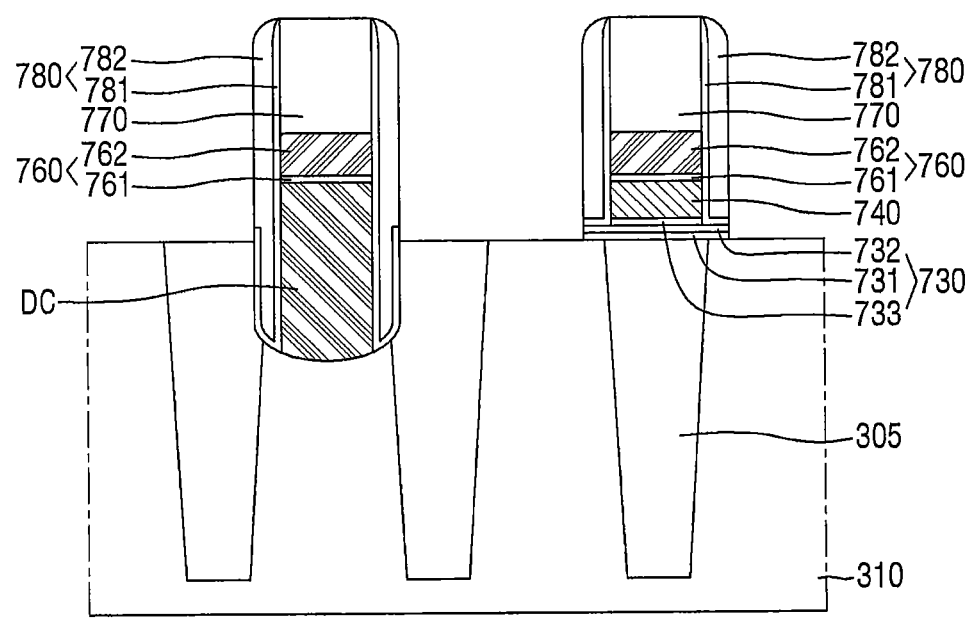
Figure 21:
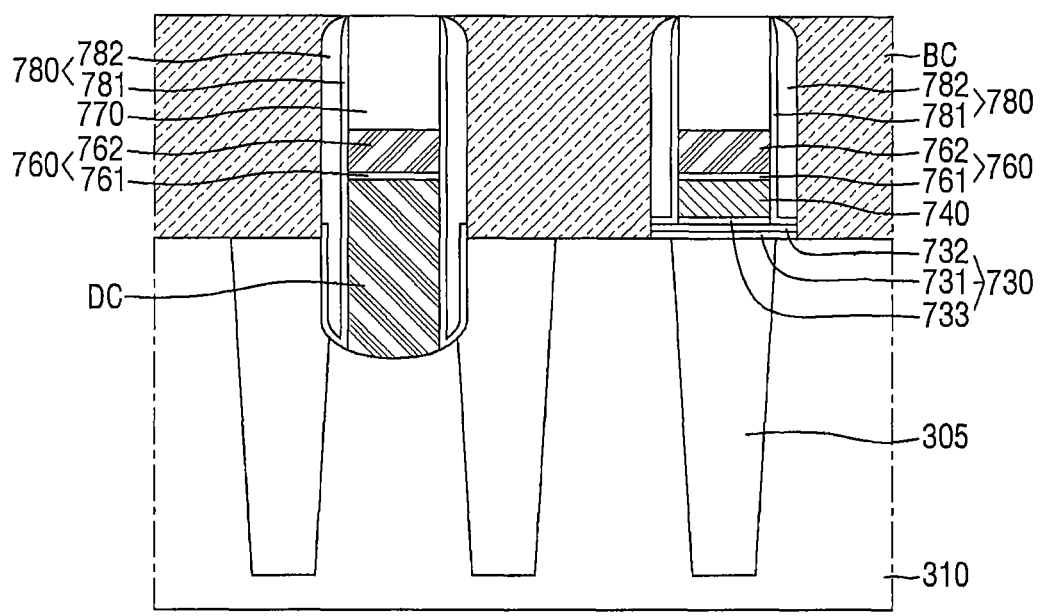

Referring to FIGS. 20 and 21, the third capping film, the third metal gate electrode 360, the third conductive film 340, the direct contact DC and the third insulating film 333 may be patterned to form a direct contact DC, a base insulating line 730, a third conductive line 740, a third metal gate electrode line 760, and a third capping pattern 770.

The base insulating line 730 may include a first insulating line 731, a second insulating line 732, and a third insulating line 733. The third metal gate electrode line 760 may include a third_1 metal gate electrode line 761 and a third_2 metal gate electrode line 762.

Subsequently, a bit line spacer 780 may be formed on both side walls of the direct contact DC, the third metal gate electrode line 760 and the third capping pattern 770. Similarly, a bit line spacer 780 may be formed on both side walls of the third insulating line 733, the third conductive line 740, the third metal gate electrode line 760, and the third capping pattern 770.

Although the bit line spacer 780 may be a single film, the bit line spacer 780 may also be or include multiple films including a first bit line spacer 781 and a second bit line spacer 782 as shown. For example, the first and second bit line spacers 781 and 782 may include, but are not limited to, one of silicon oxide film, silicon nitride film, silicon oxynitride film (SiON), silicon oxycarbonitride film (SiOCN), air, and combinations thereof.

Subsequently, a part of the second insulating film 332 and the first insulating film 331 may be removed to expose the substrate 310 or the element isolation film 305. Referring to FIG. 21, a buried contact BC may be formed on the element isolation film 305 and the substrate 310.

The buried contact BC may be in contact with the substrate 310. For example, the buried contact BC may be in contact with the terminal end of the active region AR of FIG. 2. The active region AR of the substrate 310 being in contact with the buried contact BC may function as the source/drain region.

The buried contact BC may include a conductive material. This allows the buried contact BC to be electrically connected to the active region. Although the buried contact BC may include, for example, polysilicon, the scope of the disclosure are not limited thereto.

Figure 22:
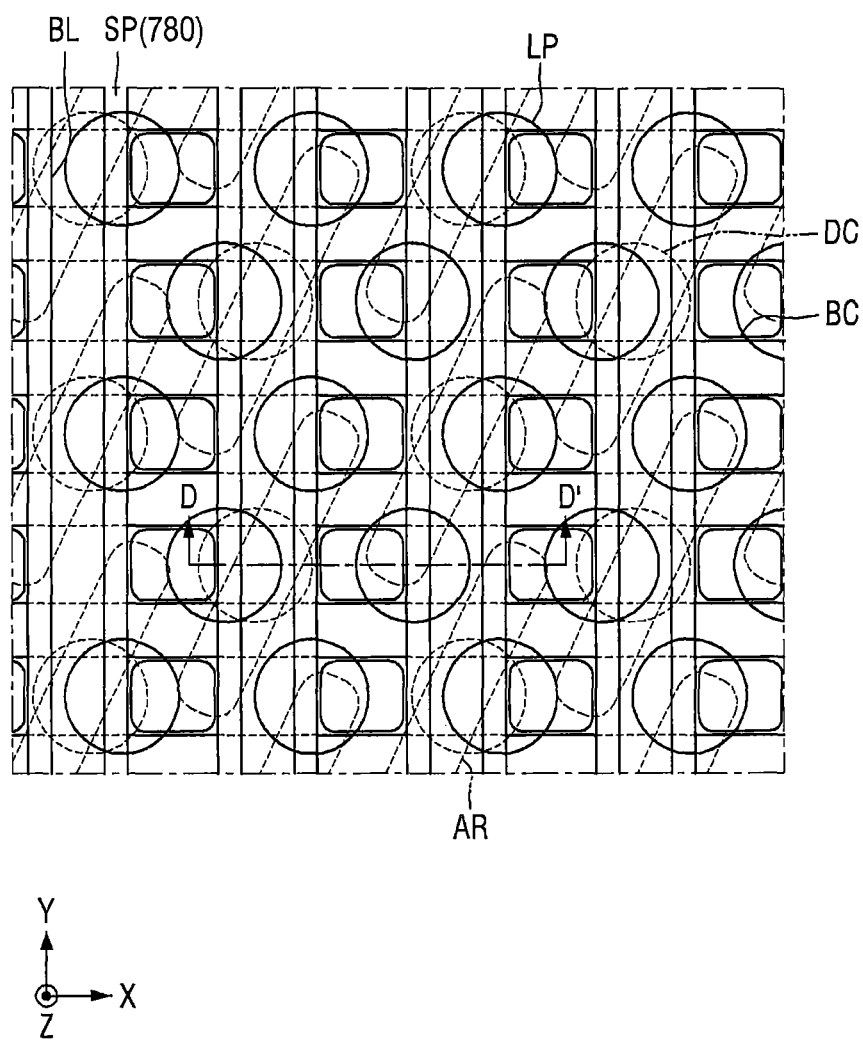
FIG. 22 is an example layout diagram of a cell region of a semiconductor device according to some embodiments of the present disclosure.
Figure 23:
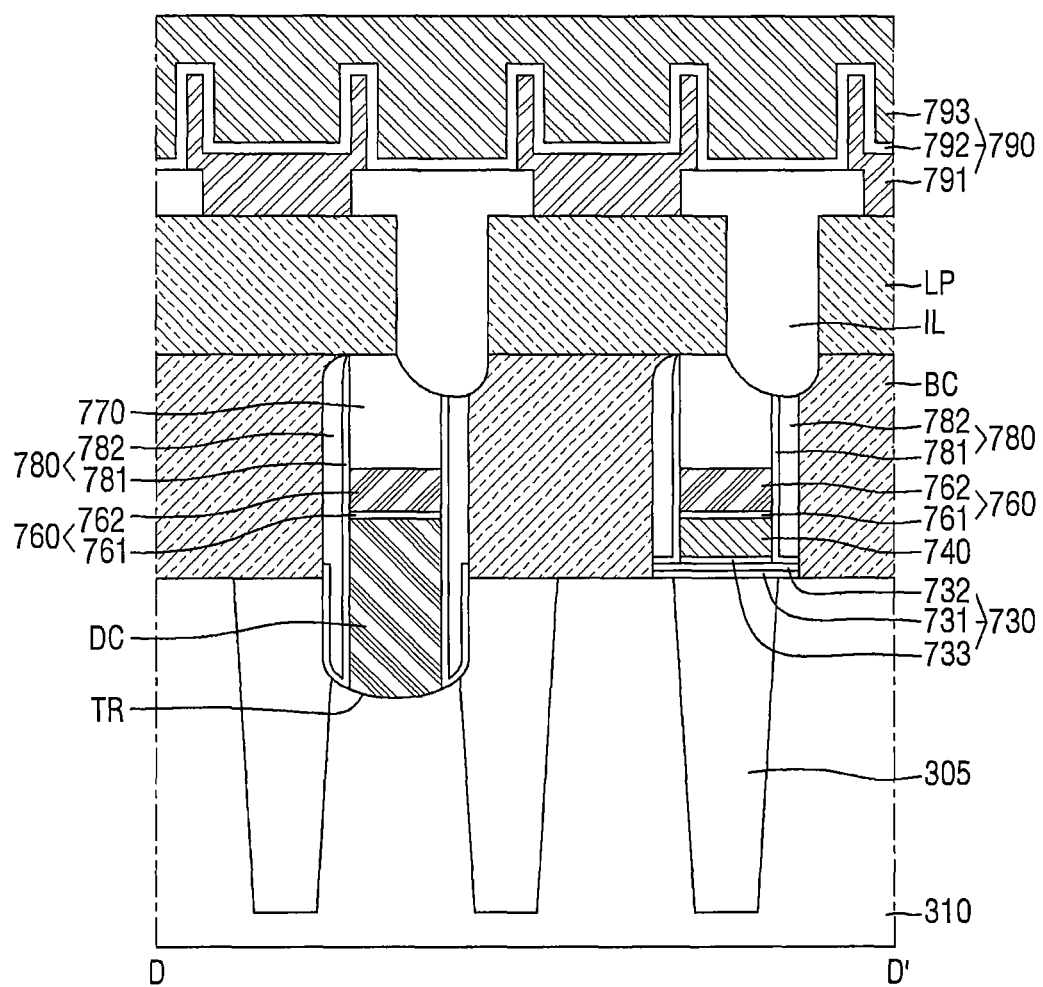
FIG. 23 is a cross-sectional view taken along a line D-D' of FIG. 22.

FIG. 22 is an example layout diagram of a cell region of a semiconductor device according to some embodiments of the present disclosure. FIG. 23 is a cross-sectional view taken along a line D-D' of FIG. 22.

Referring to FIGS. 22 and 23, the semiconductor device according to some embodiments may include a substrate 310, an element isolation film 305, a base insulating line 730, a bit line BL, a bit line spacer (SP) 780, a direct contact DC, a buried contact BC, a landing pad LP, an interlayer insulating film IL, and a capacitor 790. Like numbers refers to similar elements previously described, and a duplicate description thereof will be omitted for brevity.

The substrate 310 may include an active region AR. As shown in FIG. 22, in some embodiments, for example in response to a decrease in the design rules of the semiconductor memory device, the active region AR may be formed in the form of a diagonal bar.

The bit line BL may include a third conductive line 740 and a third metal gate electrode line 760.

The active region AR includes impurities, and may form the source/drain region. For example, the center of the active region AR may be connected to the bit line BL by the direct contact DC. Accordingly, the center of the active region AR may form one region of the source/drain regions. Also, for example, both terminal ends of the active region AR may be connected to the buried contact BC. Accordingly, the center of the active region AR may form the other region of the source/drain regions.

A landing pad LP may be placed on a part of the upper face of the third capping pattern 770 and on the upper face of the buried contact BC. Also, the landing pad LP may be in contact with the buried contact BC. Similarly to the buried contact BC, the landing pads LP may form a plurality of isolated regions spaced apart from each other.

The landing pad LP may include a conductive material. This allows the landing pad LP to be electrically connected to the buried contact BC. For example, although the landing pad LP may include tungsten (W), the scope of the present disclosure is not limited thereto.

The interlayer insulating film IL may be formed on a part of the upper face of the landing pad LP and a part of the third capping pattern 770. Also, the interlayer insulating film IL may define a region of a landing pad LP that forms a plurality of isolated regions. That is, the interlayer insulating film IL may separate a plurality of landing pads LP from each other. Also, the interlayer insulating film IL may be patterned to expose a part of the upper face of each landing pad LP.

The interlayer insulating film IL may include an insulating material to electrically separate the plurality of landing pads LP from each other. For example, although the interlayer insulating film IL may include a silicon oxide, the scope of the present disclosure is not limited thereto.

A capacitor 790 may be placed on the interlayer insulating film IL and the landing pad LP. The capacitor 790 may be in contact with a part of the upper face of the landing pad LP exposed by the interlayer insulating film IL. As a result, the capacitor 790 may be electrically connected to the source/drain regions connected to the buried contact BC. Accordingly, the capacitor 790 may store the charges in the semiconductor memory element or the like.

For example, as shown in FIG. 23, the capacitor 790 may include a lower electrode 791, a capacitive dielectric film 792 and an upper electrode 793. The capacitor 790 may store the charges in the capacitive dielectric film 792 due to a potential difference generated between the lower electrode 791 and the upper electrode 793.

The lower electrode 791 may include, for example, but is not limited to, a doped semiconductor material, a conductive metal nitride (e.g., titanium nitride, tantalum nitride, tungsten nitride, etc.), a metal (e.g., ruthenium, iridium, titanium, tantalum, etc.), conductive metal oxide (e.g., iridium oxide, etc.) and the like.

The capacitive dielectric film 792 may include, for example but is not limited to, one of silicon oxide, silicon nitride, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and combinations thereof.

The upper electrode 793 may include, for example, but is not limited to, at least one of a doped semiconductor material, a metal, a conductive metal nitride, and a metal silicide.

The capacitor 790 may have a pillar shape that extends lengthwise in the thickness direction of the substrate 310 (e.g., a vertical direction) as shown in FIG. 23. Also, although not shown in the drawing, the capacitor 790 may have a cylinder shape. However, the scope of the present disclosure is not limited thereto.

As the semiconductor devices are highly integrated, influences of parasitic capacitance and leakage current gradually increase. For example, as a gap between bit lines of DRAM (Dynamic Random Access Memory) becomes narrow, the parasitic capacitance between the bit lines, and between the bit line and the buried contact may increase.

However, the semiconductor device according to some embodiments may minimize parasitic capacitance, using silicon oxide. For example, the semiconductor device according to some embodiments may include a first bit line spacer 781 that is in contact with the third metal gate electrode line 760. Since the first bit line spacer 781 includes silicon oxide, the semiconductor device according to some embodiments may maximize a silicon oxide content between the bit line BL and the buried contact BC.

Since the silicon oxide has a lower dielectric constant than silicon nitride, the semiconductor device according to some embodiments may effectively reduce the parasitic capacitance. For example, the semiconductor device according to some embodiments can effectively reduce the parasitic capacitance, as compared with the semiconductor device in which the spacer being in contact with the bit line BL is formed of silicon nitride.

Further, since the semiconductor device according to some embodiments may effectively reduce the parasitic capacitance, it is possible to realize high integration of the semiconductor device within the range of the permitted parasitic capacitance.

In concluding the detailed description, those skilled in the art will appreciate that many variations and modifications may be made to the example embodiments without substantially departing from the scope of the present disclosure. Therefore, the disclosed embodiments of the disclosure are used in a generic and descriptive sense only and not for purposes of limitation.

What is claimed is:

1. A semiconductor device comprising:
 a substrate comprising a cell region and a core/peripheral region around the cell region;
 a gate insulating film on the core/peripheral region of the substrate;
 a conductive film having a first conductive type on the gate insulating film;
 a diffusion blocking film on the conductive film, the diffusion blocking film being spaced apart from the gate insulating film in a vertical direction;
 an impurity pattern comprising impurities having a second conductive type different from the first conductive type on the diffusion blocking film; and
 a metal gate electrode on the impurity pattern,
 wherein the diffusion blocking film comprises helium (He) and/or argon (Ar).

2. The semiconductor device of claim 1, wherein the impurities include at least one of boron (B) and phosphorus (P).

3. The semiconductor device of claim 1, wherein the gate insulating film is a nitride film.

4. The semiconductor device of claim 1, wherein a thickness of the diffusion blocking film is greater than a thickness of the conductive film.

5. The semiconductor device of claim 1, wherein a thickness of the diffusion blocking film is less than a thickness of the conductive film.

6. The semiconductor device of claim 1, wherein a concentration of He in the diffusion blocking film or a concentration of Ar in the diffusion blocking film decreases from an upper face of the diffusion blocking film toward to a lower face of the diffusion blocking film.

7. The semiconductor device of claim 1, wherein a concentration of He in the conductive film or a concentration of Ar in the conductive film is 0.

8. The semiconductor device of claim 1, wherein the diffusion blocking film is doped with He.

9. A semiconductor device comprising:
a substrate comprising a cell region and a core/peripheral region around the cell region, wherein the core/peripheral region comprises a first region and a second region;
a first gate insulating film on the first region;
a second gate insulating film on the second region;
a first conductive film having a first conductive type on the first gate insulating film;
a second conductive film having the first conductive type on the second gate insulating film;
a diffusion blocking film on the second conductive film on the second region, the diffusion blocking film being spaced apart from the second gate insulating film in a vertical direction;
an impurity pattern comprising impurities having a second conductive type different from the first conductive type on the diffusion blocking film on the second region;
a first metal gate electrode on the first conductive film on the first region; and
a second metal gate electrode on the impurity pattern on the second region,
wherein the diffusion blocking film is not on the first region, and
wherein the diffusion blocking film comprises helium (He) and/or argon (Ar).

10. The semiconductor device of claim 9, wherein a thickness of the diffusion blocking film is greater than a thickness of the second conductive film.

11. The semiconductor device of claim 9, wherein a thickness of the diffusion blocking film is less than a thickness of the second conductive film.

12. The semiconductor device of claim 9, wherein a concentration of He in the diffusion blocking film or a concentration of Ar in the diffusion blocking film decreases from an upper face of the diffusion blocking film toward to a lower face of the diffusion blocking film.

13. The semiconductor device of claim 9, wherein a concentration of He in the second conductive film or a concentration of Ar in the second conductive film is 0.

14. The semiconductor device of claim 9, wherein the diffusion blocking film is doped with He.

15. A semiconductor device comprising:
a substrate comprising a cell region and a core/peripheral region around the cell region;
a gate insulating film on the core/peripheral region, wherein the gate insulating film is a nitride film;
a first conductive film having a first conductive type on the gate insulating film;
a bit line on the cell region, wherein the bit line comprises a second conductive film having the first conductive type, and a second metal gate electrode;
a capacitor on the cell region;
a diffusion blocking film on the first conductive film on the core/peripheral region, the diffusion blocking film being spaced apart from the gate insulating film in a vertical direction;
an impurity pattern comprising impurities having a second conductive type different from the first conductive type on the diffusion blocking film on the core/peripheral region; and
a first metal gate electrode on the impurity pattern on the core/peripheral region,
wherein the diffusion blocking film comprises helium (He) and/or argon (Ar), and
wherein a concentration of He in the diffusion blocking film or a concentration of Ar in the diffusion blocking film decreases from an upper face of the diffusion blocking film toward to a lower face of the diffusion blocking film.

16. The semiconductor device of claim 15, further comprising:
a direct contact between the bit line and the cell region of the substrate, and
a buried contact electrically connected to the capacitor on the cell region of the substrate,
wherein the direct contact is electrically connected to the bit line.

17. The semiconductor device of claim 15, wherein a thickness of the first metal gate electrode and a thickness of the second metal gate electrode are equal.

18. The semiconductor device of claim 15, wherein a thickness of the diffusion blocking film is greater than a thickness of the first conductive film.

19. The semiconductor device of claim 15, wherein a thickness of the diffusion blocking film is less than a thickness of the first conductive film.

20. The semiconductor device of claim 15, wherein a concentration of He in the first conductive film or a concentration of Ar in the first conductive film is 0.

* * * * *